US012787228B2

(12) United States Patent
Patten

(10) Patent No.: US 12,787,228 B2
(45) Date of Patent: Nov. 3, 2026

(54) INTEGRATED DATA CENTER COOLING AND MINERAL RECOVERY

(71) Applicant: NetZeroImpact LLC, Austin, TX (US)

(72) Inventor: James Patten, Sandy, UT (US)

(73) Assignee: NetZeroImpact LLC, Austin, TX (US)

( * ) Notice: Subject to any disclaimer, the term of this patent is extended or adjusted under 35 U.S.C. 154(b) by 0 days.

(21) Appl. No.: 19/392,770

(22) Filed: Nov. 18, 2025

(65) Prior Publication Data

US 2026/0143643 A1 May 21, 2026

Related U.S. Application Data

(60) Provisional application No. 63/721,766, filed on Nov. 18, 2024.

(51) Int. Cl.
*H05K 7/20* (2006.01)

(52) U.S. Cl.
CPC ..... *H05K 7/20609* (2013.01); *H05K 7/20318* (2013.01)

(58) Field of Classification Search
CPC ....................... H05K 7/20609; H05K 7/20318
See application file for complete search history.

(56) References Cited

U.S. PATENT DOCUMENTS

2011/0063796 A1* 3/2011 Huettner ............ H05K 7/20827 62/529
2015/0166371 A1* 6/2015 Escher ...................... C02F 1/14 210/186
2016/0075569 A1* 3/2016 Constantz ............... C02F 1/441 210/652
2022/0002170 A1* 1/2022 Phatak .................... C02F 1/441
2024/0057289 A1* 2/2024 Benson .............. H05K 7/20281
2024/0284638 A1* 8/2024 Han .......................... F28D 7/00

* cited by examiner

*Primary Examiner* — Eric S Ruppert
*Assistant Examiner* — Hans R Weiland
(74) *Attorney, Agent, or Firm* — Thorpe North & Western LLC.

(57) ABSTRACT

An example integrated datacenter cooling and mineral recovery system can include a waste heat stream produced by a datacenter. The waste heat stream can have a temperature greater than about 50° C. A heat exchanger can have a cold side and a hot side thermally coupled to the waste heat stream. A brine stream can be sourced from a body of salt water, wherein the brine stream is coupled to the cold side of the heat exchanger such that the heat exchanger is configured to transfer heat from the waste heat stream to the brine stream to produce a mineral residue through any one or more of evaporation of water, pH adjustment, and temperature adjustment. A condenser can be in fluid communication with the brine stream and configured to condense water vapor from the brine to form a recovered water.

14 Claims, 3 Drawing Sheets

INTEGRATED DATA CENTER COOLING AND MINERAL RECOVERY

CROSS REFERENCE TO RELATED APPLICATIONS

This application claims priority to U.S. Provisional Application No. 63/721,766, filed Nov. 18, 2024, which is hereby incorporated herein by reference.

BACKGROUND

Datacenters are facilities containing large groups of networked computer servers. These servers can be used for a variety of purposes, including data storage, processing, or distribution of large amounts of data. Recently, datacenters have been increasingly designed and used for artificial intelligence technologies. These "AI" datacenters can include the computing resources needed to train and deploy complex machine learning models and algorithms. They can also collect and process information to generate responses to user prompts.

The servers and other equipment in datacenters can consume large amounts of power. Currently, datacenters use nearly 3% of all electricity generated worldwide. Increasing use of artificial intelligence is likely to further increase the amount of electricity consumed by datacenters. Some improvements to datacenter efficiency have been made by switching to wide bandgap semiconductors. Previously-used semiconductors, such as silicon and selenium semiconductors, have had bandgaps in the range of 0.7 eV to 1.5 eV. Wide bandgap semiconductors can have bandgaps greater than 2 eV. These wide bandgap semiconductors can be operated at higher power levels and higher temperatures than lower bandgap semiconductors, which can enable increased efficiency. Therefore, some newer datacenters have been designed to incorporate wide bandgap semiconductors to increase energy efficiency. The wide bandgap semiconductors can operate at temperatures in the range of 200° C. to 300° C. or greater. These datacenters often include air cooling systems that use air to cool the semiconductors and then exhaust hot air to the environment.

SUMMARY

Integrated systems and methods can be used for datacenter cooling and mineral recovery. These systems and methods can leverage the high temperature waste heat from a datacenter to recover minerals from a brine, such as saltwater from a salt lake, salt playa, ocean, etc. In one example, an integrated datacenter cooling and mineral recovery system can include a waste heat stream produced by a datacenter. The waste heat stream can have a temperature greater than about 50° C. and in some cases greater than 200° C. The system can also include a heat exchanger having a cold side and a hot side thermally coupled to the waste heat stream. A brine stream can be sourced from a body of salt water and the brine stream can be coupled to the cold side of the heat exchanger such that the heat exchanger is configured to transfer heat from the waste heat stream to the brine stream to produce a mineral residue. A condenser can be in fluid communication with the brine stream and configured to condense water vapor from brine to form a recovered water. The mineral residue can be formed by evaporation of at least a portion of water from the brine stream. Alternatively, or in addition, the mineral residue can be formed by adjusting solubility of one or more minerals though one or more of temperature and pH adjustments.

In another example, an integrated datacenter cooling and mineral recovery method can include producing a waste heat stream using a datacenter, wherein the waste heat stream has a temperature greater than about 50° C. and in some cases greater than 200° C. A brine can be sourced from a body of salt water. Heat can be transferred from the waste heat stream to the brine to produce a mineral residue. In some cases, the transferred heat can be sufficient to evaporate at least a portion of water from the brine stream to form water vapor and the mineral residue. The water vapor can be condensed to form a recovered water. Alternatively, or in addition, solubility of one or more minerals can be adjusted thought one or more of temperature and pH adjustments.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
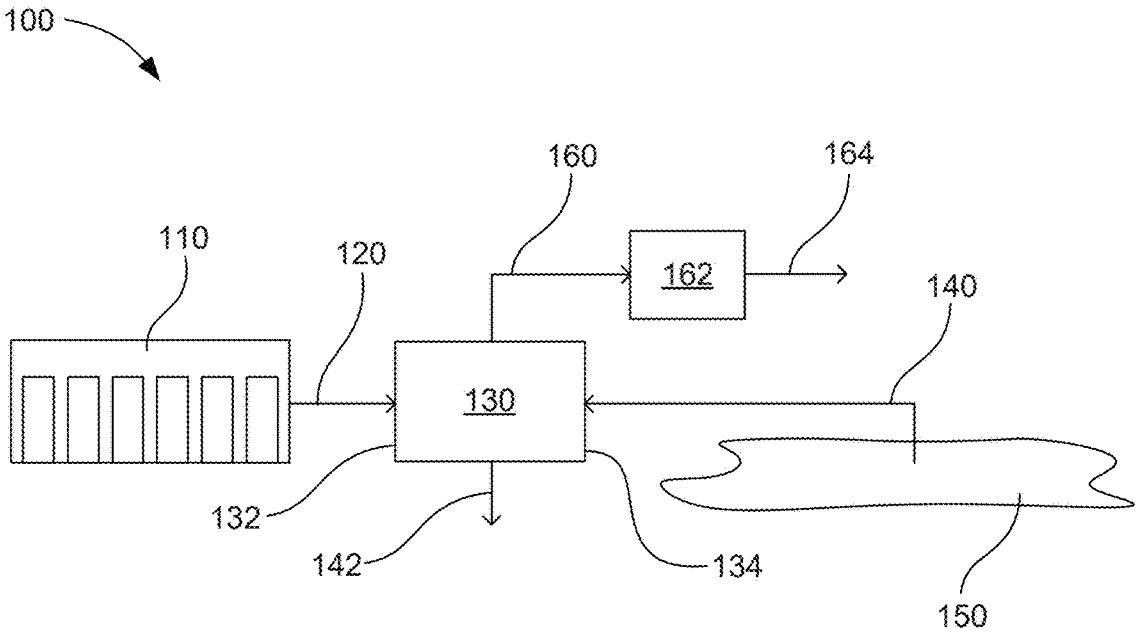
FIG. 1 is a schematic view of an example integrated datacenter cooling and mineral recovery system, in accordance with an example of the present technology.

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a stream" includes reference to one or more of such components and reference to "forming" refers to one or more of such steps.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, the term "about" is used to provide flexibility and imprecision associated with a given term, metric or value. The degree of flexibility for a particular variable can be readily determined by one skilled in the art. However, unless otherwise enunciated, the term "about" generally connotes flexibility of less than 2%, and most often less than 1%, and in some cases less than 0.01%.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" and "at least one of A, B or C" explicitly includes only A, only B, only C, or combinations of each.

Numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Integrated Datacenter Cooling and Mineral Recovery

An increasing number of datacenters are being designed to utilize wide bandgap semiconductors. These datacenters often use air cooling to cool the semiconductors that operate at high temperatures. The hot air exhaust from these datacenters can have a temperature of 50° C. to 200° C., and in some cases up to 250° C. or greater. The hot air is often exhausted to the atmosphere.

The systems and methods described herein can utilize the high temperature waste heat from a datacenter to recover minerals from mineral-containing brine. A variety of minerals can be recovered from brine by evaporating water from the brine. Different minerals may be found in different sources of brine around the world, such as salt lakes, salt playas, seawater, produced waters from oil and gas drilling, and others. As an example, lithium can be recovered from brine having a sufficient lithium concentration. This is often accomplished using evaporation ponds to evaporate water from the brine and then recover solid lithium. However, this process can take long periods of time to evaporate the brine. In some cases, additional processing can be performed such as chemically separating lithium from other ions and precipitating the lithium or other ions from sufficiently concentrated brine. The evaporation of brine can be accomplished more quickly by heating the brine. In the systems and methods described herein, the waste heat from a datacenter can be utilized to heat brine in order to evaporate water from the brine and recover minerals from the brine.

FIG. 1 shows a schematic view of an example integrated datacenter cooling and mineral recovery system 100. This system includes a datacenter 110 that produces a waste heat stream 120. The waste heat stream is directed to a hot side 132 of a heat exchanger 130. A brine stream 140 is sourced from a body of salt water 150. The brine stream is directed to a cold side 134 of the heat exchanger. The heat exchanger can be configured to transfer heat from the waste heat stream to the brine stream. In some cases, the heat can be sufficient to evaporate at least a portion of water from the brine stream, thus forming a water vapor 160 and a mineral residue 142. A condenser 162 is in fluid communication with the brine stream. The condenser can condense the water vapor to form recovered water 164. However, as described more fully below, the mineral residue can be produced without evaporation of water but rather through adjustment of solubility of the minerals through one or both temperature and pH adjustment.

In some examples, the datacenter can include a semiconductor at a temperature greater than about 200° C. The semiconductor can have a wider bandgap than a silicon semiconductor. In certain examples, the semiconductor can include silicon carbide or gallium nitride. In further examples, the waste heat stream can be a stream of hot air. In some cases, the heat exchanger can be a direct contact heat exchanger in which the hot air directly contacts the brine stream. The body of salt water can be a salt lake, salt playa, or ocean. In some examples, the brine stream can have an initial salinity greater than about 35 g/L. The brine stream can have a pressure of about 1 atm or greater when the at least a portion of water evaporates from the brine stream. In some examples, the mineral residue can include salt, lithium, trace minerals, or a combination thereof. The system can also include an electric generator powered by the waste heat stream configure to convert a portion of heat from the waste heat stream to electric power. In further examples, the system can include a recovered water stream connecting the condenser to the body of salt water to re-introduce the recovered water into the body of salt water.

The datacenter can produce waste heat at a temperature greater than about 50° C. and in some cases greater than 200° C. In particular examples, the waste heat temperature can be from about 50° C. to about 500° C., in some cases 200° C. to about 500° C., or from about 200° C. to about 300° C., or from about 200° C. to about 250° C., or from about 50° C. to about 200° C., or from about 50° C. to about 150° C., or from about 50° C. to about 100° C. In still further examples, the waste heat temperature can be greater than about 250° C., or greater than about 300° C. In some examples, the waste heat stream can be a stream of hot air. However, other fluids can be used in some cases, such as steam, pressurized water, oils, glycols, or others.

Semiconductors used in the datacenter can be wide bandgap semiconductors. As used herein, "wide bandgap" refers to semiconductors with a bandgap of about 2 eV or greater. In some examples, the datacenter can include a semiconductor having a bandgap from about 2 eV to about 5 eV, or from about 2 eV to about 4 eV, or from about 2 eV to about 3 eV, or from about 2.5 eV to about 4 eV. Some wide bandgap semiconductor materials can include silicon carbide, diamond, boron, aluminum nitride, aluminum arsenide, gallium nitride, gallium phosphide, gallium selenide, cadmium sulfide, zinc oxide, zinc selenide, zinc telluride, copper oxide, tin dioxide, and boron nitride. In certain examples, the datacenter can include silicon carbide, gallium nitride, or a combination thereof. The semiconductors can be operated at a temperature of about 200° C. or greater. In certain examples, the semiconductors can be operated at a temperature from about 200° C. to about 500° C., or from about 200° C. to about 300° C., or from about 200° C. to about 250° C.

In other examples, the datacenter can include semiconductors with a relatively smaller bandgap. These semiconductors can have a bandgap from about 0.7 eV to about 2 eV in some examples, or from about 0.7 eV to about 1.5 eV. These semiconductors can operate in the temperature ranges described above, or sometimes in lower temperature ranges such as from about 50° C. to about 200° C., or from about 50° C. to about 150° C., or from about 50° C. to about 100° C. Datacenters can also include a combination of different semiconductors, which can include wide bandgap semiconductors and narrower bandgap semiconductors.

Semiconductors can be incorporated in a variety of hardware used in datacenters. Some examples of hardware that can included semiconductors include central processing units (CPUs), graphics processing units (GPUs), AI accelerator chips, random access memory (RAM), solid state drives (SSDs), memory controllers, network cards, switches, routers, power supplies, and others.

The systems can include a single waste heat stream or multiple waste heat streams in various examples. In some cases, the datacenter may include equipment that has different cooling needs and which may operate at different temperatures. The different equipment can be cooled with multiple separate cooling streams, creating multiple waste heat streams that may be at different temperatures. In some examples, the datacenter can include an air conditioning system that cools the equipment in the datacenter using recirculated air-conditioned air. The air conditioning system can produce waste heat, such as at a condenser coil of the air conditioning system. The waste heat can be carried away by another stream of air or by a different heat transfer fluid. Alternatively, a datacenter may cool the equipment with air and then pump that air out of the datacenter as the waste heat stream, such that the waste heat stream comprises the same air that was used to directly cool the equipment. Other cooling arrangements can also be used, such as liquid cooling systems that use a circulating liquid to directly cool the semiconductors in the datacenter. In such examples, the waste heat stream can comprise the same liquid that was circulated to cool the semiconductors, or the liquid cooling system can include a heat sink or other heat exchanger that transfers heat to a stream of air or another heat transfer fluid that is then used as the waste heat stream. In still further examples, the datacenter can utilize immersion cooling, in which the semiconductor components are immersed in a heat transfer fluid. Such systems can also use the same heat transfer fluid as the waste heat stream, or heat can be transferred to a stream of air or another heat transfer fluid to be used as the waste heat stream. Thus, air-cooled or liquid cooled equipment can involve a heat transfer fluid which transports heat away from the equipment and through one or more heat exchangers to transfer heat to the brine. The use of an intermediate heat exchanger can further protect datacenter equipment from brine solutions which tend to be much more corrosive than air or liquid coolants used in cooling equipment. Heat transfer fluids can include condensed water, steam, brine, molten salts, or other suitable heat transfer fluid. A combination of any of these types of cooling can also be used.

When multiple waste heat streams are produced by the datacenter, the streams can be combined together to form a single waste heat stream or the streams can be utilized separately. The system can include multiple heat exchangers, with the multiple waste heat streams flowing to the multiple heat exchangers. The brine stream can flow through the multiple heat exchangers, so that heat is transferred from each of the waste heat streams to the brine stream directly or via intermediate heat transfer fluids. In certain examples, the multiple waste heat streams can transfer heat to the brine stream through a series of heat exchangers, where the waste heat streams are arranged in order of ascending or descending temperature. For example, a waste heat stream with a lower temperature can be connected to a first heat exchanger to preheat the brine, and another waste heat stream with a higher temperature can be connected to a second heat exchanger that further increases the temperature of the preheated brine.

Figure 2:
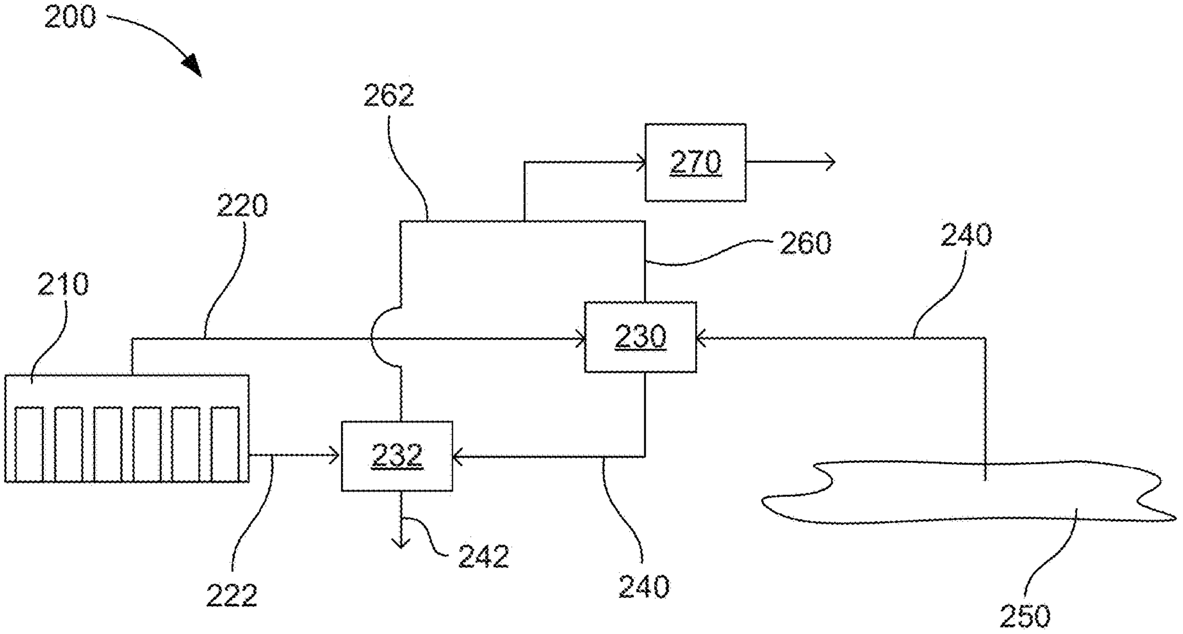
FIG. 2 is a schematic view of another example integrated datacenter cooling and mineral recovery system, in accordance with an example of the present technology.

FIG. 2 shows a schematic view of another example integrated datacenter cooling and mineral recovery system 200. This system includes a datacenter 210 that produces a first waste heat stream 220 and a second waste heat stream 222. The first waste heat stream flows to a first heat exchanger 230, and the second waste heat stream flows to a second heat exchanger 232. A brine stream 240 is sourced from a body of salt water 250. The brine stream flows through the first heat exchanger and the second heat exchanger. Each heat exchanger can transfer heat from the waste heat streams to the brine stream. Additionally, in this example, a first water vapor stream 260 flows out of the first heat exchanger and a second water vapor stream 262 flows out of the second heat exchanger. These water vapor streams are combined and sent to a condenser 270 to condense the water vapor. The brine stream is converted to a mineral residue stream 242 by the evaporation of the water vapor, which concentrates minerals in the brine stream. In some cases, the first waste heat stream can have a higher temperature than the second waste heat stream. In other cases, the second waste heat stream can have a higher temperature than the first waste heat stream. In certain examples, one of the waste heat streams can have a temperature from about 50° C. to about 200° C., and the other waste heat stream can have a temperature greater than 200° C.

Brine can be sourced from a body of salt water. The body of salt water can be a salt lake, a salt playa, the ocean, an underground saltwater source such as a source of produced waters from oil and gas drilling, or another body of salt water. In particular examples, the body of salt water can be a salt lake or a salt playa. Some salt lakes can be lakes having no outlet, which causes the salinity of the lake to be higher than in fresh water lakes. Examples of salt lakes include the Great Salt Lake, the Dead Sea, and others. Salt playas can refer to geological areas that form ephemeral lakes during wet weather, but which can be dry at other times. Salt playas can have soil with high levels of soluble salts so that the ephemeral lakes have a high salinity. Sourcing brine from the body of salt water can include directly pumping the brine from the body of salt water to a first heat exchanger via pipes (i.e. either short adjacent or long remote distances). Alternatively, sourcing brine can include transferring brine to a tank for transport via rail, truck, barge, or another suitable vehicle.

The brine used in the systems and methods described can have a salinity that is at least as high as the average salinity of seawater. In certain examples, the brine can have a salinity of about 35 g/L or greater. In further examples, the salinity can be from about 35 g/L to about 400 g/L, or from about 35 g/L to about 350 g/L, or from about 35 g/L to about 300 g/L, or from about 70 g/L to about 350 g/L, or from about 150 g/L to about 350 g/L, or from about 250 g/L to about 350 g/L. As used herein, salinity refers to the total concentration of dissolved salts in the brine. The dissolved salts typically include sodium chloride and can include dissolved lithium salts and other salts. Other salts that may be dissolved in the brine can include cations selected from the group consisting of sodium, calcium, magnesium, lithium, potassium, iron, aluminum, and combinations thereof, and anions selected from the group consisting of chloride, fluoride, iodide, bicarbonate, sulfate, nitrate, borate, and combinations thereof. In further examples, the brine can have a concentration of a target mineral to be extracted, such as lithium. The concentration of the target mineral to be extracted can be from about 50 mg/L to about 5,000 mg/L, or from about 100 mg/L to about 5,000 mg/L, or from about 200 mg/L to about 4,000 mg/L, or from about 500 mg/L to about 4,000 mg/L, or from about 1,000 mg/L to about 5,000 mg/L.

In some examples, the datacenter can be located near the source of the brine. For example, the datacenter can be built on a site local to a body of salt water. A distance between the datacenter and the body of salt water can be from about 1 m to about 1 km, or from about 1 m to about 500 m, or from about 1 m to about 100 m, in some examples. Alternatively, the datacenter can be located remote from the source of brine. In such cases, the brine can be transported via piping, rail, or truck. In either configuration, the heat exchanger can be oriented adjacent to a datacenter (i.e. within 0.5 km, and most often within 100 m). Accordingly, heat can be extracted from the waste heat stream and into the brine sources either directly in a single heat exchanger, or through one or more intermediate heat exchangers.

As explained above, heat from the waste heat stream from the datacenter can be transferred to brine sources from the body of salt water to evaporate water from the brine or in some cases adjust solubility of certain minerals by adjusting temperature, and optionally also adjusting pH. This can be accomplished using a heat exchanger. In some examples, the heat exchanger can be located at the datacenter, and brine can be pumped or otherwise transferred from the body of salt water to the datacenter. In other examples, the heat exchanger can be located at the body of salt water, and the waste heat stream from the datacenter can be directed to the body of salt water. In still other examples, the heat exchanger can be at an intermediate location between the datacenter and the body of salt water and the waste heat stream and the brine stream can both be directed to the intermediate location.

In some examples, the heat exchanger can be configured to accept a continuous flow of brine from the body of salt water. In one example, at least a portion of the water in the brine can be continuously evaporated, forming water vapor and a mineral residue. In some cases, the mineral residue can be a concentrated brine or a solid mineral residue. In further examples, the heat exchanger can be configured to accept brine in batches, with each batch being evaporated to form water vapor and a mineral residue before accepting another batch. In various examples, the brine can be evaporated in an evaporation pond, a holding tank, a flash vessel, or a distillation column. In certain examples, the brine can be evaporated by heating the brine to a boiling point temperature.

In certain examples, the heat exchanger can be a direct contact heat exchanger. Direct contact heat exchangers allow a fluid on the hot side and a fluid on the cold side of the heat exchanger to directly contact one another. This type of heat exchanger can be particularly useful in the present systems when the waste heat stream is a stream of hot air. As mentioned above, in some cases the datacenter can be air-cooled, and the waste heat stream from the datacenter can be a stream of hot air at a temperature greater than 50° C. or even greater than 200° C. The heat exchanger can be configured to bring this hot air into direct contact with the brine stream to transfer heat from the hot air to the brine with high efficiency. In some examples, the heat exchanger can be configured to mix the hot air with the brine. For example, the hot air can be bubbled or sparged through the brine. A portion of the water in the brine stream can evaporate into the stream of hot air. In some examples, this humid air can be directed to a condenser to condense fresh water from the humid air.

In alternative examples, the heat exchanger can prevent the waste heat stream from directly contacting the brine stream. In such heat exchangers, the waste heat stream can transfer heat to the brine stream through a wall or other component of the heat exchanger. Some example heat exchangers that can be used include shell and tube heat exchangers, double pipe heat exchangers, finned tube heat exchangers, plate heat exchangers, and others. These types of indirect contact heat exchangers can be used with waste heat streams comprising any type of heat transfer fluid. As mentioned above, the waste heat stream can include hot air, steam, pressurized water, oils, glycols, or others. These can be directed to an indirect contact heat exchanger to transfer heat to the brine stream without directly contacting the brine stream. In a particular example, the brine stream can pass through a finned tube heat exchanger, and the waste heat stream can be a stream of hot air that is directed past the fins of the finned tube heat exchanger.

Some dissolved ions present in brine can make the brine corrosive toward certain materials found in some heat exchangers. Therefore, the heat exchanger can include corrosion-resistant materials such as stainless steel, titanium, nickel alloys, zirconium, silicon carbide, graphite, polymers, or combinations thereof. In some examples, the heat exchanger can include a coating of a corrosion-resistant material over another material, such as carbon steel or copper.

As mentioned above, the brine stream can be coupled to a cold side of the heat exchanger and the waste heat stream can be coupled to the hot side of the heat exchanger. The terms “cold side” and “hot side” do not imply any particular temperature for any part of the heat exchanger, but rather these terms are used to describe the relative temperatures of the fluids that are exchanging heat through the heat exchanger. The fluid on the cold side of the heat exchanger can receive heat from the fluid on the hot side of the heat exchanger because the fluid on the cold side of the heat exchanger has a temperature that is lower than the temperature of the fluid on the hot side of the heat exchanger. The “cold side” and “hot side” can refer to two different fluid pathways in some examples, where the fluids flowing through these pathways are thermally coupled such that heat is transferred from the hotter fluid to the colder fluid. As explained above, a direct contact heat exchanger can be used in some cases. In a direct contact heat exchanger, the two fluids can be mixed together in the heat exchanger. For example, hot air from the waste heat stream can mix with the colder brine stream. In the case of a direct contact heat exchanger, the cold side can refer to the fluid pathway used by the brine stream to enter the heat exchanger, and the hot side can refer to the fluid pathway used by the waste heat stream to enter the heat exchanger. Other heat exchangers can be configured to maintain the brine stream and the waste heat stream as two separate streams, without allowing direct contact between the streams. The streams can still be in thermal contact, such as through thermally conductive components of the heat exchanger, which allows heat to be transferred from the waste heat stream to the brine stream. In either case, the brine stream is understood to be coupled to the cold side of the heat exchanger and the waste heat stream is understood to be coupled to the hot side of the heat exchanger.

The rate of evaporation of the brine stream can depend on several factors, including the temperature of the brine stream, the concentration of dissolved salts in the brine stream, pressure, and others. In certain examples, the rate of evaporation can be increased by reducing the pressure of the brine stream, such as by using vacuum pressure (i.e., less than 1 atm absolute pressure). Thus, in some examples, the system can apply a vacuum pressure to the brine stream to increase evaporation of water. However, the equipment used to apply vacuum pressure can be expensive and energy intensive. Therefore, in some examples, the system can evaporate water from the brine stream without actively reducing the pressure. Thus, the brine stream can be at or about the ambient pressure, such as about 1 atm absolute pressure. In some examples, the brine stream may be at a higher pressure due to the pressure being increased by pumping.

In further examples, the rate of evaporation of the brine stream can be increased by contacting the brine stream with dry air, since the dry air can readily absorb evaporated water vapor from the brine stream. In some examples, the waste heat stream from the datacenter can be in the form of dry hot air. The dry hot air can have a relative humidity level of 30% or less, or 20% or less, or 15% or less, or 10% or less in certain examples. As mentioned above, in some cases the dry hot air of the waste heat stream can contact the brine stream in a direct contact heat exchanger.

It is noted that the water vapor produced by evaporating water from the brine stream can be a pure water vapor stream in some examples. In such examples, the water vapor can be formed without any other gases mixed with the water vapor. This water vapor can be separated from the liquid brine stream and then condensed by a condenser. In other examples, the water vapor can be mixed with air or another gas. In such examples, the stream of mixed water vapor and other gas can be fed to a condenser, and the water vapor can condense out of the gas stream.

After the brine stream has been heated using the waste heat stream, and at least a portion of the water in the brine stream has been evaporated, the remaining material from the brine stream can be referred to as a mineral residue. The mineral residue can be a liquid with a higher mineral concentration than the original brine, or the mineral residue can be a solid. The mineral residue can include salt (sodium chloride) and other minerals that can be recovered. In certain examples, the mineral residue can include lithium. In further examples, the mineral residue can include other trace minerals, such as magnesium, calcium, potassium, boron, iron, aluminum, rubidium, strontium, gallium, uranium, copper, zinc, bromine, scandium, titanium, rare earth elements, trace elements, and others.

The brine stream can be partially evaporated to provide a more concentrated solution of a target mineral, such as lithium. The target mineral can then be separated from the concentrated solution using a suitable separation process. For example, lithium can be separated from the concentrated solution by Direct Lithium Extraction (DLE). In some examples, lithium can be separated from the concentrated solution using ion pumping, redox-couple electrodialysis (RCE), selective precipitation reactions, or other processes. Similar processes can be used for other target minerals. In this way, the target minerals can be recovered without fully evaporating and drying the brine stream. In certain examples, one or more target minerals can be separated from the concentration brine and then the concentrated brine can be either returned to the body of salt water, or disposed of in another location, or subjected to additional evaporation to evaporate the remainder of water from the concentrated brine.

Consistent with the above principles, as an alternative, or in addition, to evaporation driven precipitation, selective precipitation of different minerals can be accomplished by controlling pH, concentrations, and temperature across one or more heating and cooling stages. Such approaches can sometimes result in recovery of minerals that were initially in the ppb (less than 1000 ppb) range from the original body of salt water. In these cases, evaporation of water from the brine may not occur at all. However, in cases where water vapor is formed from the additional evaporation can also be condensed to make fresh water, which can be returned to the body of salt water or used for other purposes.

In addition to the components described above, in some examples the system can also include an electric generator powered by the waste heat stream. The electric generator can be configured to convert a portion of the heat from the waste heat stream to electric power. In certain examples, the electric generator can operate using a steam cycle, where heat from the waste heat stream can be used to generate steam in the steam cycle. In other examples, the electric generator can be a thermoelectric generator configured to convert heat directly to electricity. The electric generator can be configured to convert a portion of the heat from the waste heat stream to electricity, but to allow a sufficient amount of heat to remain in the waste heat stream so that the waste heat stream can be subsequently used to evaporate brine as described above. In an alternative example, a portion of the heat in the waste heat stream can first be used to evaporate brine, and then the waste heat stream can subsequently be utilized by the electric generator to generate electric power. The electricity generated by the electric generator can be used to operate brine pumps, the heat exchanger, mineral recovery equipment, a condenser for condensing evaporated water vapor, or to supplement the electricity consumed by the datacenter. In some examples, the electric generator can make the datacenter more power-efficient because the electric generator can replace a portion of the electric power consumed by the datacenter. In certain examples, the electricity generated by the electric generator can be used to power Direct Lithium Extraction, redox-couple electrodialysis, or other separation processes used to separate lithium or other minerals from the brine stream.

The system can produce recovered water by condensing the water vapor evaporated from the brine. The recovered water can be used for any purpose that can utilize fresh water. It certain cases, it may be desirable to re-introduce the recovered water into the body of salt water. This can have the effect of reducing the salinity of the body of salt water. Reduced salinity can be desirable in some bodies of salt water, such as salt lakes, which have reached undesirably high levels of salinity through natural or man-made causes. Thus, the systems described herein can be used to counteract increasing salinity in these bodies of salt water. Reintroducing the recovered water can also replenish the body of salt water to ensure that the body of water does not run dry so that additional brine can be pumped out of the body of salt water to use in the system for mineral recovery.

In some cases, bodies of salt water may have such a high salinity that the total amount of certain minerals present in the body of salt water exceeds solubility limits. In these cases, solid mineral deposits can be present on the lakebed or floor of the body of salt water because these solid minerals may not be soluble in the concentrated brine. However, when fresh water produced by the systems described herein is re-introduced into the body of salt water, this can allow some of the solid mineral deposits to dissolve into the brine. Thus, the actual salinity of the brine may not decrease in the body of salt water because more of the solid minerals have been dissolved in the brine. However, this can be useful because it allows the minerals from the solid mineral deposits to be accessed and recovered by continued operation of the system.

Figure 3:
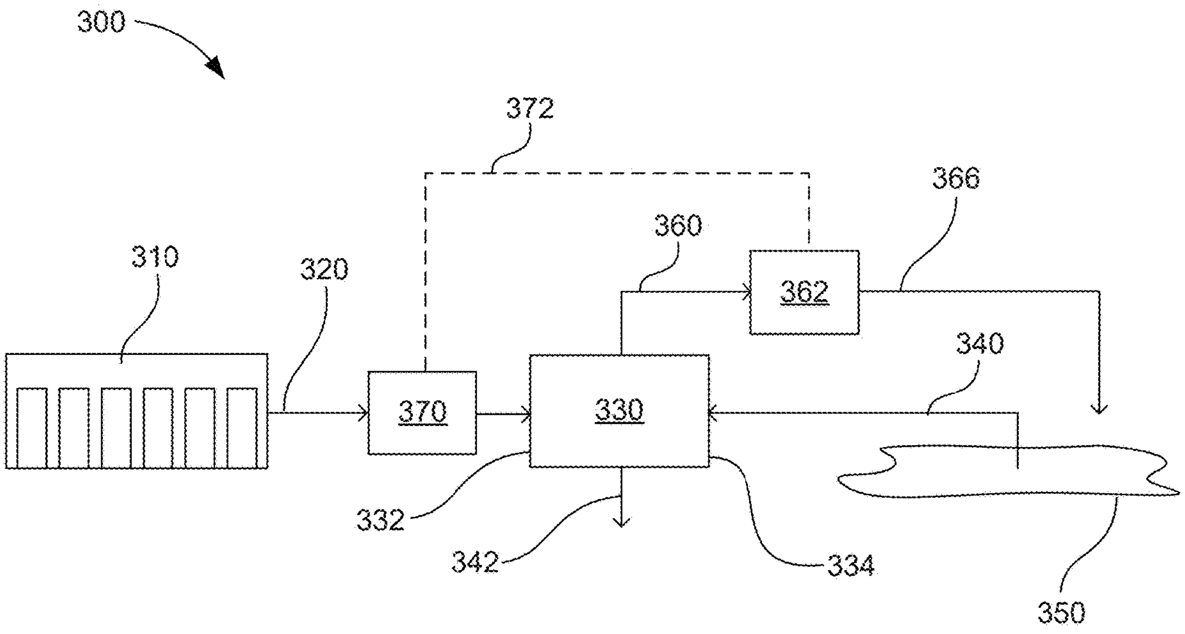
FIG. 3 is a schematic view of another example integrated datacenter cooling and mineral recovery system, in accordance with an example of the present technology.

FIG. 3 shows another example system 300 that includes a datacenter 310 located near a body of salt water 350. A waste heat stream 320 is directed from the datacenter to a hot side 332 of a heat exchanger 330, which is located at an intermediate location between the datacenter and the body of salt water. However, in this example, the waste heat stream first passes through an electric generator 370, which utilizes a portion of heat from the waste heat stream to generate electric power. A brine stream 340 is sourced from the body of salt water and directed to a cold side 334 of the heat exchanger. The heat exchanger is configured to transfer heat from the waste heat stream to the brine stream to form a mineral residue 342. As mentioned above, in some cases the transferred heat can be sufficient to evaporate at least a portion of water from the brine stream, thus forming water vapor 360 and the mineral residue 342. In other cases, one or more stages can include heat transfer which is sufficient to adjust solubility of a specific mineral or minerals by adjusting temperature and optionally pH without also evaporating water from the brine.

A condenser 362 can be in fluid communication with the brine stream. The condenser condenses the water vapor to form recovered water. The condenser utilizes electric power produced by the electric generator and transmitted through electric line 372. After being condensed, the recovered water flows in a recovered water stream 366 from the condenser to the body of salt water and the recovered water is re-introduced into the body of salt water.

In some examples where there are multiple waste heat streams produced by the datacenter, one waste heat stream can be used by an electric generator while another waste heat stream can be used for heating brine. In a particular example, the hotter of two waste heat streams can go to the electric generator first, and then to the brine, while the cooler of the waste heat streams can go straight to heating the brine. In an alternative example, the hotter waste heat stream can go to the electric generator first and then the exhaust from the generator can be combined with the cooler waste heat stream and the combined stream can go to heat brine. In another alternative example, the cooler waste heat stream can be used by the electric generator and the hotter waste heat stream can be used to heat the brine.

Figure 4:
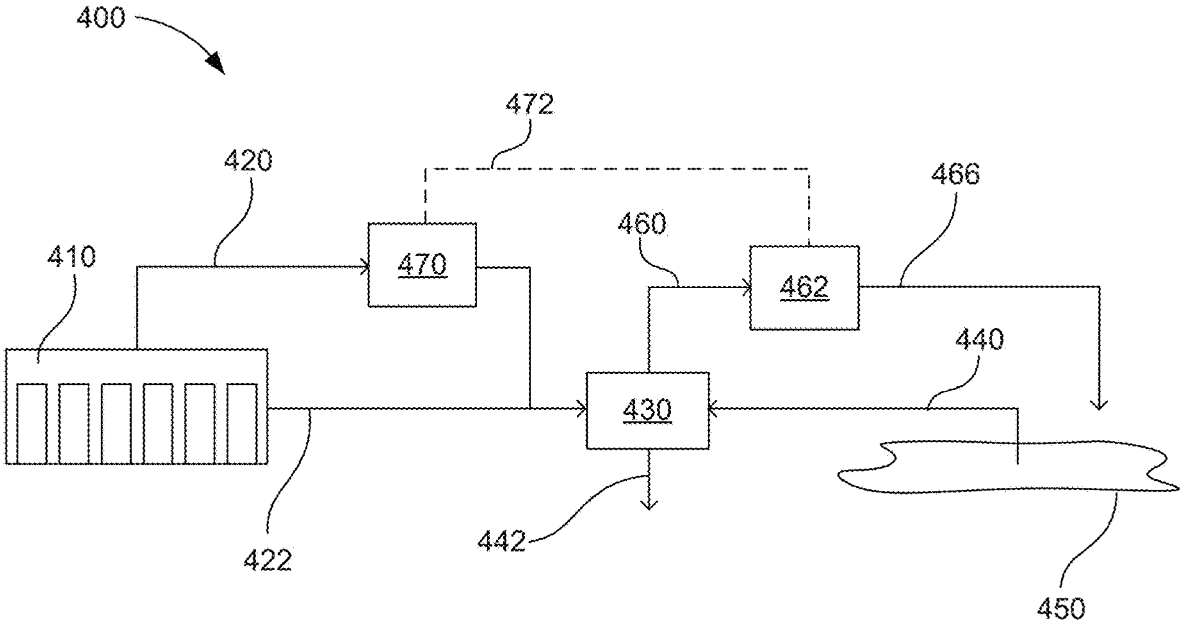
FIG. 4 is a schematic view of yet another integrated datacenter cooling and mineral recovery system, in accordance with an example of the present technology.

FIG. 4 shows a schematic view of another example system 400 that includes a datacenter 410 that produces a first waste heat stream 420 and a second waste heat stream 422. The first waste heat stream is directed to an electric generator 470 that uses heat from the first waste heat stream to generate electricity. The remaining heat of the first waste heat stream after passing through the electric generator is directed to mix together with the second waste heat stream. This combined stream is directed to a heat exchanger 430 that heats a brine stream 440 sourced from a body of salt water 450. A stream of water vapor 460 can be evaporated from the brine stream and directed to a condenser 462 to condense the water vapor and form a recovered water stream 466. The recovered water stream is then re-introduced into the body of salt water. In this example, the electricity generated by the electric generator is transmitted through an electric line 472 to power the condenser. Additionally, the portion of the brine stream that is not evaporated is recovered as a mineral residue 442. As with other configurations, the transferred heat can be sufficient to form the mineral residue without also evaporating a portion of the water from the brine. In these cases, solubility of one or more minerals can be selectively adjusted via adjustment of temperature and optionally pH.

Figure 5:
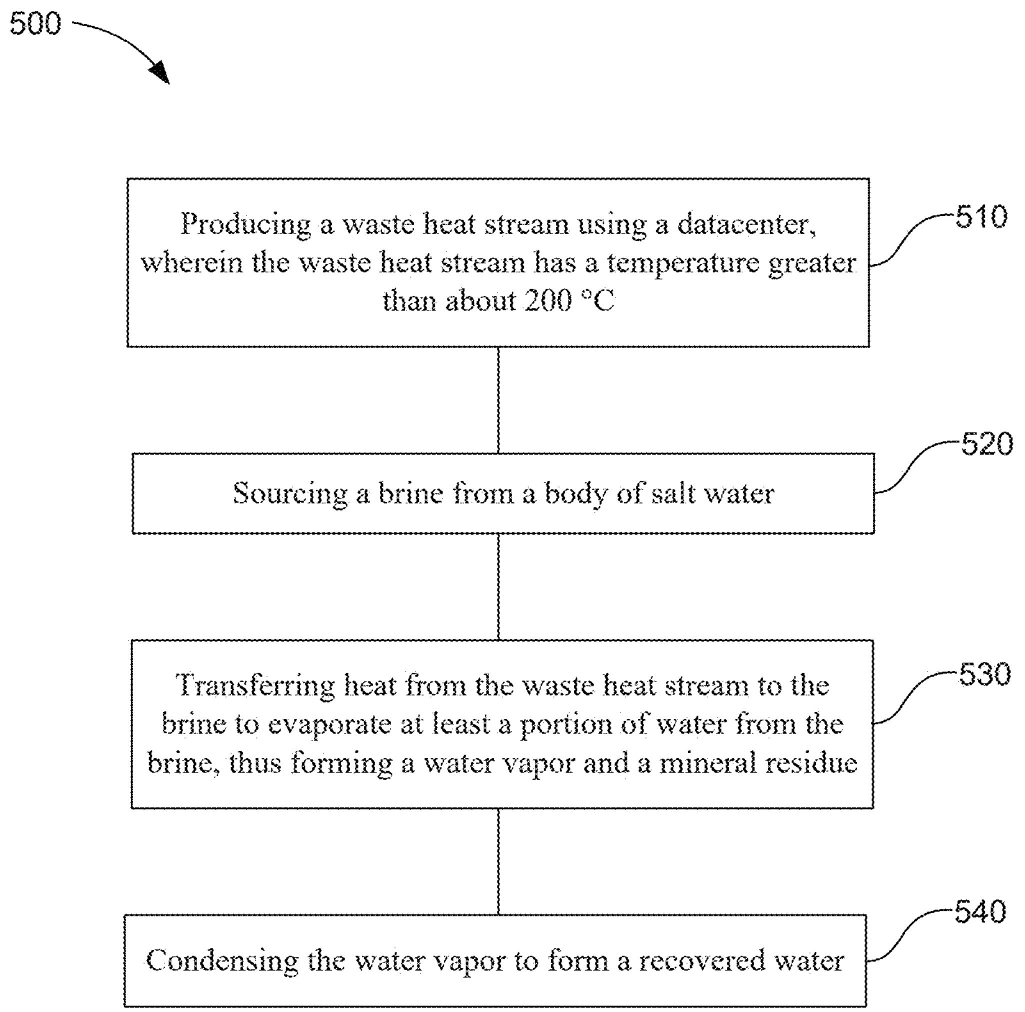
FIG. 5 is a flowchart illustrating an example integrated datacenter cooling and mineral recovery method, in accordance with an example of the present technology.

The present disclosure also describes methods for datacenter cooling and mineral recovery that can include any of the features of the systems described above. FIG. 5 is a flowchart illustrating an example integrated datacenter cooling and mineral recovery method 500. This method includes: producing a waste heat stream using a datacenter, wherein the waste heat stream has a temperature greater than about 50° C. and in some cases greater than 200° C. (510); sourcing a brine from a body of salt water (520); and transferring heat from the waste heat stream to the brine to form a mineral residue (530). In some cases, the heat transfer can be sufficient to evaporate at least a portion of water from the brine, thus forming a water vapor and the mineral residue (530). Alternatively, transferred heat can be sufficient to adjust solubility of one or more minerals in the brine to form the mineral residue by adjusting temperature and optionally also pH. The method can also include condensing the water vapor to form a recovered water (540). In further examples, methods can utilize any of the equipment and components of the systems described above. The methods can also include any of the steps, processes, and operations described above.

In some examples, the datacenter can include a semiconductor at a temperature greater than about 200° C. The semiconductor can have a wider bandgap than a silicon semiconductor. In certain examples, the semiconductor can include silicon carbide or gallium nitride. The waste heat stream can be a stream of hot air. In some examples, the body of salt water can be a salt lake, ocean, or salt playa. The brine can have an initial salinity greater than about 35 g/L.

The brine can have a pressure of about 1 atm or greater when the at least a portion of water evaporates from the brine. In some examples, the mineral residue can include salt, lithium, trace minerals, or a combination thereof. The method can also include generating electric power using an electric generator powered by the waste heat stream. The method can also include re-introducing the recovered water into the body of salt water.

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. An integrated datacenter cooling and mineral recovery system, comprising:

a waste heat stream produced by a datacenter, wherein the waste heat stream has a temperature greater than about 50° C.;

a heat exchanger having a cold side and a hot side thermally coupled to the waste heat stream;

a brine stream sourced from a body of salt water, wherein the brine stream is coupled to the cold side of the heat exchanger such that the heat exchanger is configured to transfer heat from the waste heat stream to the brine stream to produce a mineral residue; and a condenser in fluid communication with the brine stream configured to condense water vapor from the brine stream to form a recovered water, wherein at least one of:

the temperature of the waste heat stream is greater than about 200° C.;

the brine stream has a pressure of about 1 atm or greater when at least a portion of water evaporates from the brine stream; or the system further comprises a recovered water stream connecting the condenser to the body of salt water to re-introduce the recovered water into the body of salt water.

2. The system of claim 1, wherein the datacenter comprises a semiconductor at a temperature greater than about 200° C.

3. The system of claim 2, wherein the semiconductor has a wider bandgap than a silicon semiconductor.

4. The system of claim 2, wherein the semiconductor comprises silicon carbide or gallium nitride.

5. The system of claim 1, wherein the waste heat stream is a stream of hot air.

6. The system of claim 5, wherein the heat exchanger is a direct contact heat exchanger in which the hot air directly contacts the brine stream.

7. The system of claim 1, wherein the body of salt water is a salt lake or salt playa.

8. The system of claim 1, wherein the brine stream has an initial salinity greater than about 35 g/L.

9. The system of claim 1, wherein the mineral residue comprises salt, lithium, trace minerals, or a combination thereof.

10. The system of claim 1, further comprising an electric generator powered by the waste heat stream configured to convert a portion of heat from the waste heat stream to electric power.

11. An integrated datacenter cooling and mineral recovery method, comprising:

producing a waste heat stream using a datacenter, wherein the waste heat stream has a temperature greater than about 50° C.;

sourcing a brine from a body of salt water; and transferring heat from the waste heat stream to the brine to produce a mineral residue, wherein at least one of:

the temperature of the waste heat stream is greater than about 200° C.;

the brine has a pressure of about 1 atm or greater during the transferring heat;

the transferring heat is sufficient to evaporate at least a portion of water from the brine to form a water vapor and the mineral residue and the method further comprises condensing the water vapor to form a recovered water and the method further comprises re-introducing the recovered water into the body of salt water; or the transferring heat is sufficient to adjust solubility of minerals in the brine to produce the mineral residue without evaporating water from the brine.

12. The method of claim 11, wherein the waste heat stream is a stream of hot air.

13. The method of claim 11, wherein the mineral residue comprises salt, lithium, trace minerals, or a combination thereof.

14. The method of claim 11, further comprising generating electric power using an electric generator powered by the waste heat stream.

* * * * *